(12) United States Patent
Zeng

(10) Patent No.: US 6,929,988 B2
(45) Date of Patent: Aug. 16, 2005

(54) METHOD OF MAKING AN ULTRA DENSE TRENCH-GATED POWER DEVICE WITH THE REDUCED DRAIN-SOURCE FEEDBACK CAPACITANCE AND MILLER CHARGE

(75) Inventor: Jun Zeng, Torrance, CA (US)

(73) Assignee: Fairchild Semiconductor Corporation, South Portland, ME (US)

( * ) Notice: Subject to any disclaimer, the term of this patent is extended or adjusted under 35 U.S.C. 154(b) by 0 days.

(21) Appl. No.: 10/678,444

(22) Filed: Oct. 1, 2003

(65) Prior Publication Data

US 2004/0061171 A1 Apr. 1, 2004

Related U.S. Application Data

(62) Division of application No. 10/092,692, filed on Mar. 7, 2002, now Pat. No. 6,683,346.
(60) Provisional application No. 60/274,760, filed on Mar. 9, 2001.

(51) Int. Cl.[7] .............................................. H01L 29/80
(52) U.S. Cl. ...................... 438/192; 438/193; 438/195; 438/284
(58) Field of Search .................................. 438/192, 193, 438/195, 284; 257/328–335

(56) References Cited

U.S. PATENT DOCUMENTS

| | | | |
|---|---|---|---|
| 4,914,739 A | 4/1990 | Malhi | |
| 5,126,807 A | 6/1992 | Baba et al. | |
| 5,468,663 A | 11/1995 | Bertin et al. | |
| 5,504,357 A | 4/1996 | Kim et al. | |
| 5,929,482 A | * 7/1999 | Kawakami et al. | ......... 257/328 |
| 5,998,833 A | 12/1999 | Baliga | |
| 6,262,439 B1 | 7/2001 | Takeuchi et al. | |
| 2001/0022379 A1 | 9/2001 | Brush et al. | |
| 2002/0036319 A1 | 3/2002 | Baliga | |
| 2002/0096714 A1 | 7/2002 | Zeng et al. | |
| 2002/0135007 A1 | 9/2002 | Koike et al. | |

FOREIGN PATENT DOCUMENTS

| | | |
|---|---|---|
| EP | 1 170 803 A2 | 1/2002 |
| WO | WO 02/13257 | 2/2002 |

* cited by examiner

Primary Examiner—Fetsum Abraham
(74) Attorney, Agent, or Firm—Thomas R. FitzGerald, Esq.

(57) ABSTRACT

The cellular structure of the power device includes a substrate that has a highly doped drain region. Over the substrate there is a more lightly doped epitaxial layer of the same doping. Above the epitaxial layer is a well region formed of an opposite type doping. Covering the wells is an upper source layer of the first conductivity type that is heavily doped. The trench structure includes a sidewall oxide or other suitable insulating material that covers the sidewalls of the trench. The bottom of the trench is filled with a doped polysilicon shield. An interlevel dielectric such as silicon nitride covers the shield. The gate region is formed by another layer of doped polysilicon. A second interlevel dielectric, typically borophosphosilicate glass (BPSG) covers the gate. In operation, current flows vertically between the source and the drain through a channel in the well when a suitable voltage is applied to the gate.

9 Claims, 8 Drawing Sheets

|  | VTH (V) | RSP @ 10V (mohm.cm^2) | RSP @ 5V (mohm.cm^2) | VDSBR (V) | Cgd (pF/cm^2) | RSP* Cgd (mohm.pF) |
|---|---|---|---|---|---|---|
| CONV_2.0um | 1.2 | 0.16 | 0.22 | 36.97 | 7050 | 1128 |
| NEW_2.0um | 1.22 | 0.19 | 0.26 | 37.58 | 1180 | 224.2 |
| CONV_3.0um | 1.17 | 0.21 | 0.29 | 37.33 | 4922 | 1033.62 |
| NEW_3.0um | 1.16 | 0.25 | 0.34 | 37.48 | 874 | 218.5 |
| CONV_4.0um | 1.13 | 0.27 | 0.46 | 39.97 | 3521 | 950.67 |
| NEW_4.0um | 1.13 | 0.32 | 0.54 | 40.08 | 635 | 203.2 |

FIG. 1A

METHOD OF MAKING AN ULTRA DENSE TRENCH-GATED POWER DEVICE WITH THE REDUCED DRAIN-SOURCE FEEDBACK CAPACITANCE AND MILLER CHARGE

CROSS-REFERENCE TO RELATED APPLICATIONS

This application is a divisional of U.S. patent application Ser. No. 10/092,692 filed Mar. 7, 2002 now U.S. Pat. No. 6,683,346 which claims the benefit of the priority date of U.S. provisional patent application Ser. No. 60/274,760 filed Mar. 9, 2001.

FIELD OF THE INVENTION

The present invention is directed to semiconductor devices and, more particularly, to a trench MOSFET with reduced Miller capacitance having improved switching speed characteristics.

BACKGROUND OF THE INVENTION

The semiconductor industry is witnessing an increasing demand for low-output-voltage DC—DC converters with very fast transient response and higher power efficiency for high frequency power conversion applications. When the operation frequency reaches 1 MHz or even higher, the power losses of a synchronous buck DC—DC converter will be dominated by the switching losses. Switching losses in a power MOSFET occur during charging/discharging the drain-gate feedback capacitance. The corresponding gate charge is called Miller Charge. Thus, the reduction of Miller capacitance is one of most important focus to improve DC—DC converter efficiency.

Also, as the cell density and speed of a microprocessor increases, more current is needed to power the microprocessor. This means that the DC—DC converter is required to provide a higher output current. The increase of the output current raises the conduction loss of not only the lower switches but also the upper switches in synchronous DC—DC converter. Therefore, in order to power an advanced microprocessor, the power MOSFETS, which are used as the upper and the lower switches in a DC—DC converter must have both low switching power losses and low conduction power losses. The switching losses can be reduced by lowering on-resistance. Unfortunately, lowering the on-resistance raises the Miller capacitance. For example, in order to reduce the on-resistance of a power MOSFET, the most efficient way is to reduce the device cell pitch and increase the total channel width. Both of these result in an increase of the drain-gate overlay area. As the consequence, the device's Miller capacitance, or Miller charge increases.

Due to gate to drain capacitance's significant impact on device switching speed, a series of improvements for minimizing it's impact have been proposed. These improvements include tailoring of source-drain ion implant angles and gate spacers, in order to obtain sufficient gate overlap of source-drains for maintaining low channel resistance, while still minimizing the associated capacitance values. One such effort to minimize Miller capacitance is a process step that locally increases the gate oxide thickness in the region of gate to drain overlap. However, that process is difficult to control because you need to maintain overlap while growing the thick oxide in the bottom of the trench and etching back. Therefore, what is needed is a method that will achieve low switching power losses and low conductivity power losses.

SUMMARY OF THE INVENTION

The present invention is directed towards a power device that has low switching power losses and low conductivity power losses. A power device having features of the present invention comprises a first substrate layer that is highly doped with a dopant of a first conductivity type, forming a drain. Over this first layer is a second layer that is lightly doped with the same conductivity dopant as the first layer. Above this second layer is a third layer, doped with a second conductivity dopant that is opposite in polarity to the first conductivity type. A fourth layer highly doped with the first conductivity dopant, is on the opposite surface of the semiconductor substrate. A trench extends from this fourth layer, into the second layer. This trench divides the fourth layer into a plurality of source regions. The trench also has sidewalls adjacent to the third and fourth layers for controlling a channel layer. Finally, this trench also has upper and lower conductive layers that are separated by a dielectric layer.

According to another aspect of the invention, the upper conductive layer in the trench forms a gate electrode for controlling current through a channel adjacent the sidewall of the trench. The polysilicon gate layer, the polysilicon shield layer and the interlevel dielectric layer are suitably sized so that the bottom of the polysilicon gate layer is proximate the curvature of the well region. This will minimize the overlap between the gate and drain, and therefore minimize the gate-to-drain capacitance.

According to still another aspect of the invention, the device originally described can have a source metal layer over the device and in electrical contact with the fourth layer, so that it is in contact with the source regions. This source metal also is in contact with the third layer doped with the second conductivity type. This metal layer will also be in contact with the lower conductive layer of the trench at peripheral locations around the cells of the device. The lower conductive layer, or shield layer, will be at the same electrostatic potential as the source. Now the capacitance at the bottom of the trench is no longer gate-to-drain it is now gate-to-source, because the shield is tied to the source.

BRIEF DESCRIPTION OF THE DRAWINGS

FIG. 1A is a table showing comparative results.

DETAILED DESCRIPTION OF THE DRAWINGS

Figure 1:
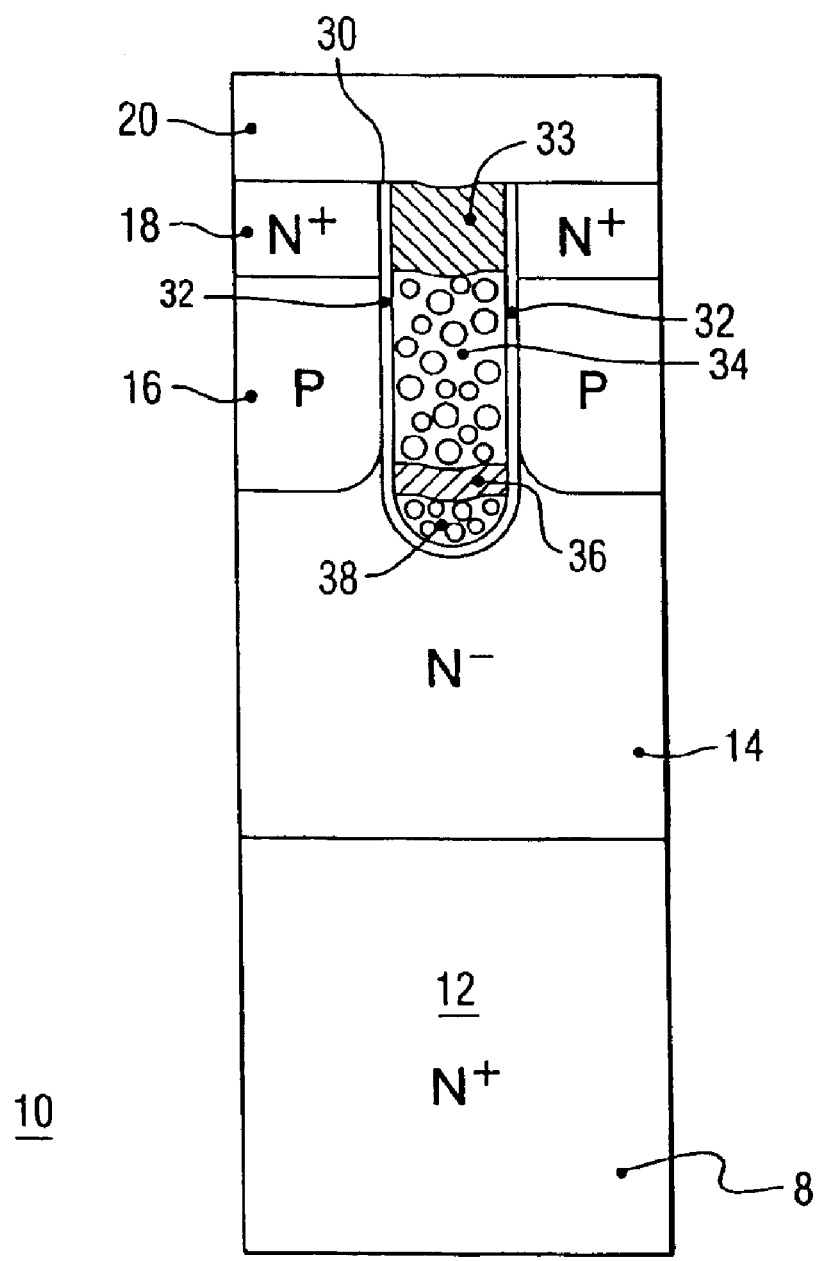
FIG. 1 is a cross-section of a DMOS cell structure.
Figure 2:
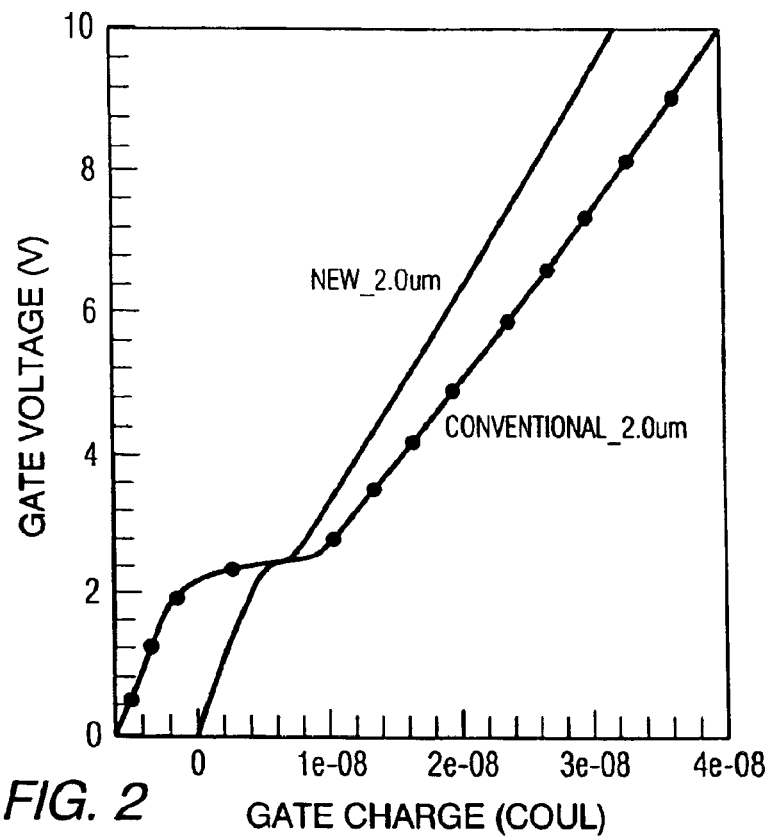
FIG. 2 is a first graph showing gate voltage as a function of gate charge for new and conventional 0.2 micron cell pitch devices.
Figure 3:
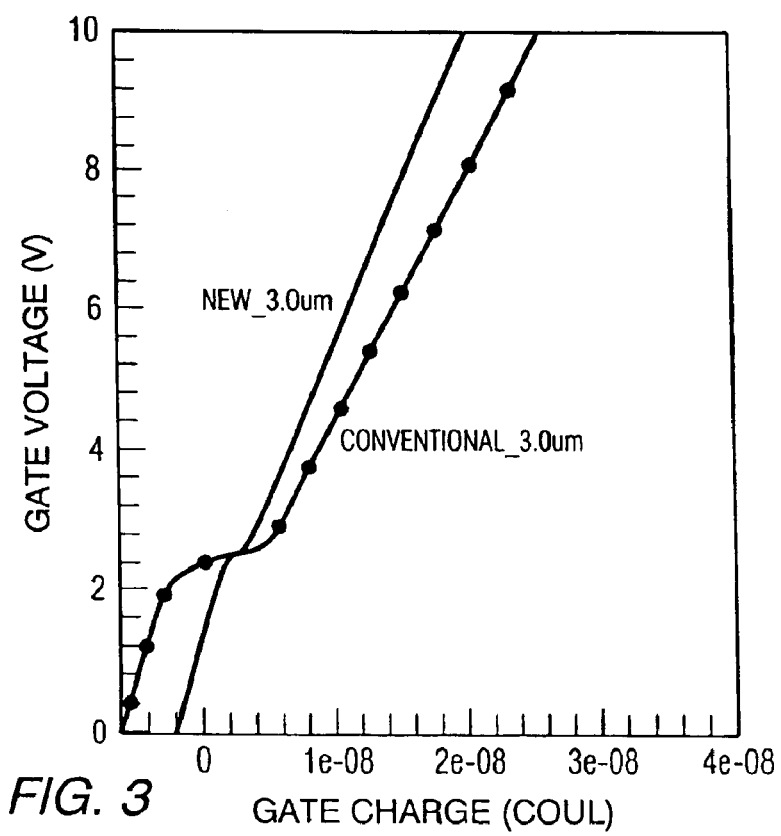
FIG. 3 is a second graph similar to FIG. 2 for 0.3 micron cell pitch devices.
Figure 4:
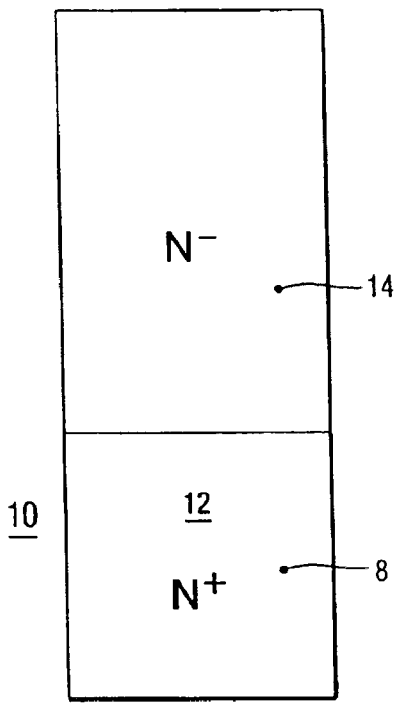
FIG. 4 is an n-type doped epi-layer grown on the N+ substrate.

The new device structure is shown in FIG. 1. This new device 10 includes a buried polysilicon shield layer 38 between the polysilicon gate 34 and the drain terminal 12. The polysilicon shield layer 38 contacts the source metal 20 at periphery of the die, and has the same electrostatic potential as the Source Metal 20. See FIG. 19. As the consequence, the gate and drain displacement currents flow through the source 18 and the polysilicon shield 38 during the switching transient, and the feedback between the drain terminal and the gate terminal during the gate turn on/off transients is greatly suppressed. Making use of this new device structure, a much lower Miller Charge can be obtained with minimum sacrifice of the on-resistance. Furthermore, the contradiction between the on-resistance and Miller Charge can be depressed significantly. The electrical characteristics of both the new device and the conventional trench-gated power MOSFET were evaluated by using the computer simulations. The results are summarized in FIG. 1A. The new device 10 disclosed in this invention has much less Miller capacitance, Cgd, with a small increase of the on-resistance when compared to the conventional device without a shield. For example, for the device with cell pitch 2.0 $\mu$m, the new device achieves about 84% reduction of gate-to-drain capacitance (Cgd ) with only 18% increase of the on-resistance per unit area, RSP, when compared to the conventional device. The figure of merit, RSP* Cgd, is defined as the product of on-resistance and Miller capacitance. Results show about 80% improvement when comparing the new device to the conventional device. The gate voltage vs. gate charge characteristics of both devices are given in FIGS. 2 and 3, respectively for 2.0 $\mu$m cell pitch and 3.0 $\mu$m cell pitch. These figures demonstrate that the new device disclosed in this invention has dramatically reduced the Miller charge, which is represented by the width of plateau portion in the curves of the gate voltage vs. gate charge. Additionally, because of the reduction in gate-to-drain capacitance, the device can be made very dense without sacrificing switching speed.

FIG. 1 is a cross-sectional view of a single cell of a multi-cellular trench gate device 10 of the present invention. Those skilled in the art will understand that the trench gate device 10 may be used in connection with power devices such as DMOS devices as well as other power devices, including insulated gate bipolar transistors (IGBTs) and MOS gated thyristors. In such devices the cellular pattern shown in FIG. 1 is repeated by having multiple cells, all of which are divided by the trench gate.

The cellular structure of a typical MOSFET 10 includes a substrate 12 that has a highly doped drain or N+ region. Over the substrate 12 there is a more lightly doped epitaxial layer 14 of the same doping polarity. Above the epitaxial layer 14 is a well region 16 formed of opposite or P-type doping. Covering the P-wells 16 is an upper source layer 18 that is heavily N-type doped. The trench structure 30 includes a sidewall oxide 32 or other suitable insulating material that covers the sidewalls of the trench 30. The bottom of the trench 30 is filled with a polysilicon shield 38. An interlevel dielectric such as silicon nitride 36 covers the shield 38. The gate 34 is formed by another layer of highly doped polysilicon. A second interlevel dielectric 33, typically borophosphosilicate glass (BPSG) covers the gate 34. In operation, current flows vertically between the source 18 and the drain 12 through a channel in the well 16 when a suitable voltage is applied to the gate 34.

The device 10 is formed by the series of process steps shown in FIGS. 4–17. Initially, a suitable substrate 8 is highly doped to form an N+ region 12. Then, an epitaxial layer 14 is grown on the other surface of the substrate 8. The epitaxial layer 14 is either grown as a lightly doped N– layer or is then suitably doped as N– after it is grown. Please note that although the epitaxial layer 14 is shown larger than the substrate, the difference in size is strictly for purposes of explaining the invention. Those skilled in the art understand that the substrate is normally significantly greater in thickness than is the epitaxial layer.

Figure 5:
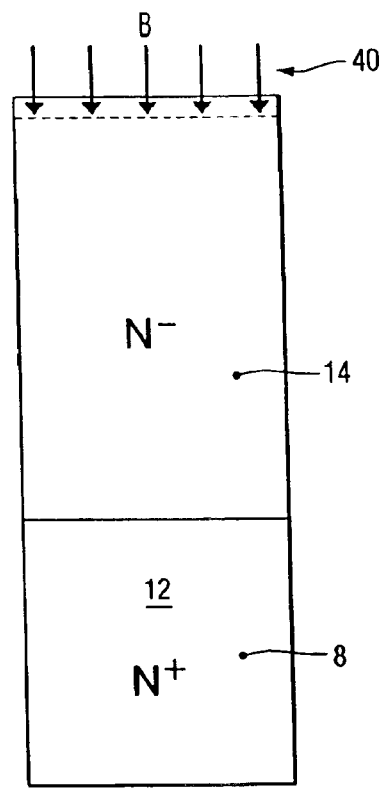
FIG. 5 is pad oxidation followed by the Boron implant and annealing.
Figure 6:
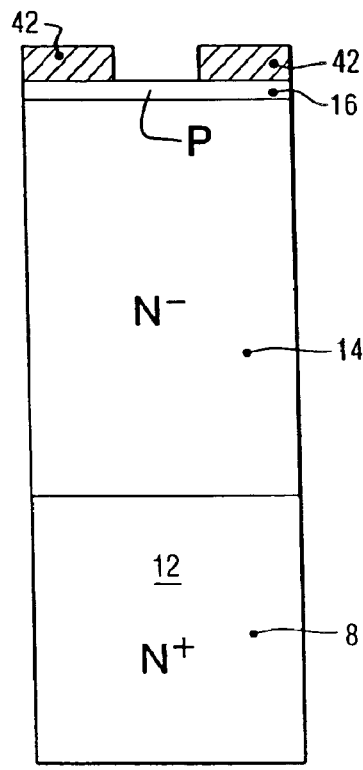
FIG. 6 is LTO oxide deposition, followed by the LTO pattern definition by using photo-mask/etch steps.
Figure 7:
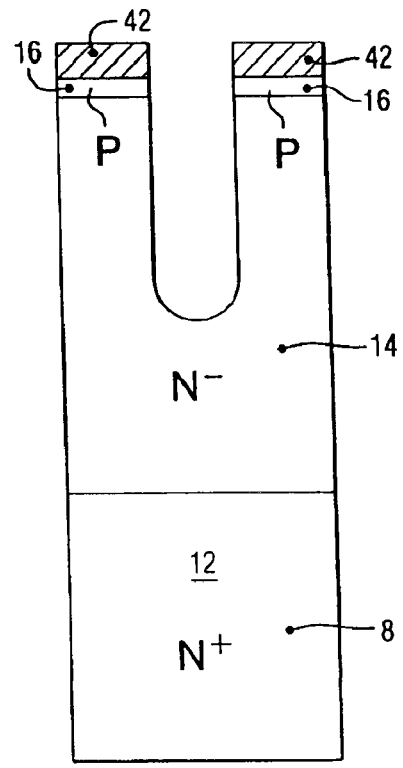
FIG. 7 is silicon etch to form the trench structure.
Figure 8:
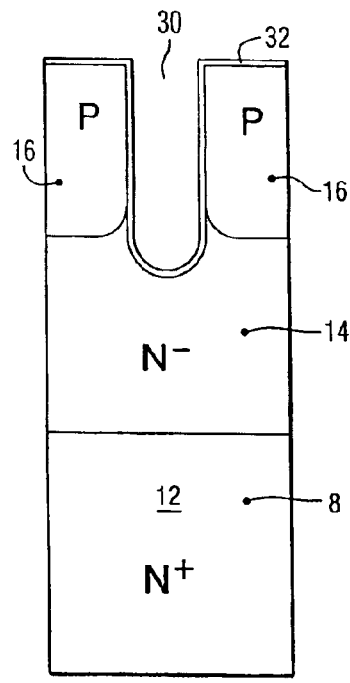
FIG. 8. is LTO removal followed by Sacrificial Oxidation and Gate oxidation.

FIG. 5 shows boron ions 40 implanted into the upper surface of the epitaxial layer 14 to form a latent P-well 16 in FIG. 6. FIG. 6 also shows the surface of the epitaxial layer covered with a low-temperature oxide 42 that is patterned to expose future trench regions. Trenches are etched as shown in FIG. 7. Turning to FIG. 8, the trenches 30 may be etched by any suitable process, including a wet etch or a dry plasm etch. Such etching is conventional and is known to those skilled in the art. After completion of the etching, the entire wafer is subjected to an oxidation process in order to grow a relatively thin gate oxide layer 32 over the entire wafer, including the sidewalls of the trench 30. Prior to growing the gate oxide layer, the low-temperature oxide mask is stripped. The oxidation step is performed at a temperature high enough to drive in the boron implants and form well region 16.

Figure 9:
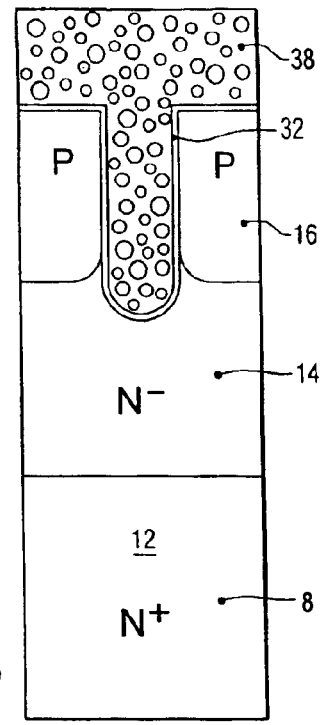
FIG. 9 is polysilicon fill.
Figure 10:
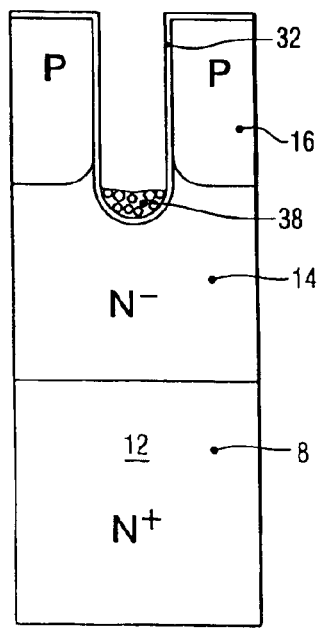
FIG. 10 is polysilicon recess etch forming the polysilicon shield layer.
Figure 11:
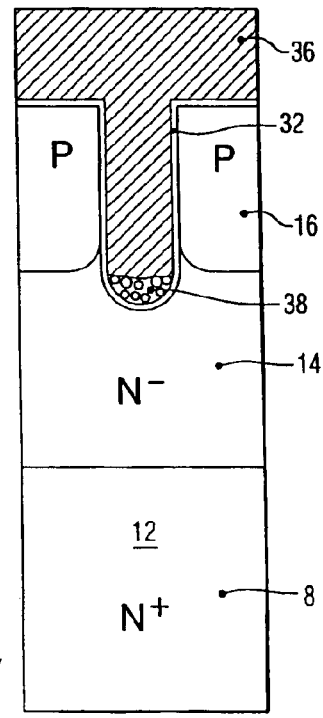
FIG. 11 is IDL (SiN) deposition.
Figure 12:
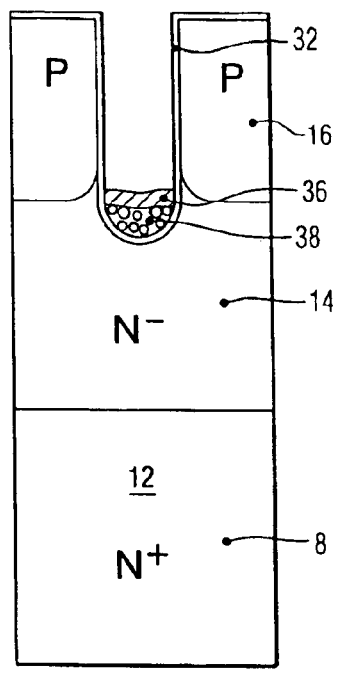
FIG. 12 is IDL (SiN) recess etch.
Figure 13:
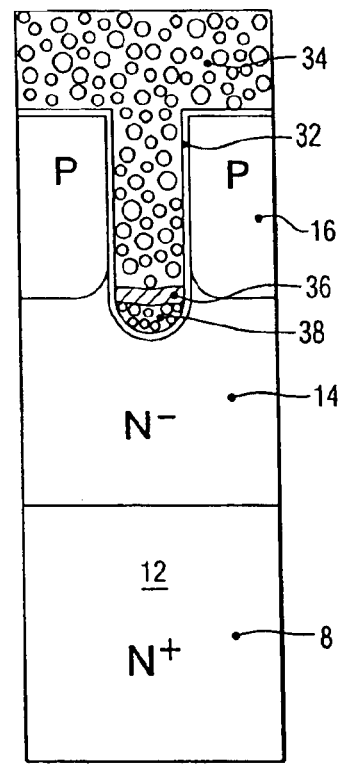
FIG. 13 is polysilicon refill.

In a next step, shown in FIG. 9, the entire wafer is covered with a polysilicon layer 38 that fills the trench 30. The polysilicon layer 38 is etched away until it leaves a residual polysilicon shield 38 in the bottom of the trenches 30, as shown in FIG. 10. Turning now to FIG. 11, an interlevel dielectric layer 36 is formed from silicon nitride or other suitable insulator over the entire wafer, including in the trenches 30. The interlevel dielectric layer 36 is suitably etched, as shown in FIG. 12, to leave a layer within the trenches and covering the polysilicon shield layer 38. Next, FIG. 13 shows a polysilicon gate layer 34 deposited over the entire wafer and into the trenches 30. The polysilicon gate includes highly doped polysilicon so as to provide a conductive gate material. Other materials are possible, but polysilicon is the preferred material. The polysilicon gate layer and the polysilicon shield layer 38 and the interlevel dielectric layer 36 are suitably sized so that the bottom of the polysilicon gate layer 34 is proximate the curvature of the well region 16. This will minimize the overlap between the gate and drain, and therefore minimize the gate-to-drain capacitance.

Figure 14:
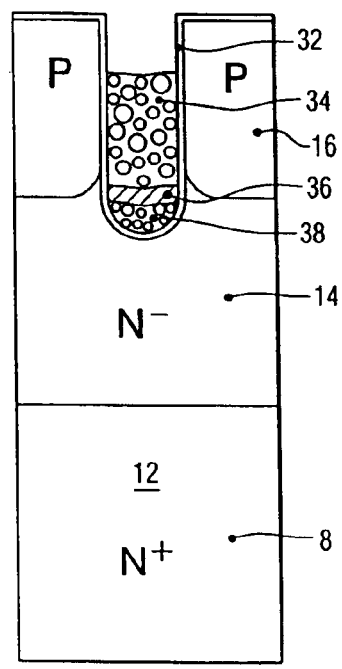
FIG. 14 is polysilicon recess etch forming the polysilicon gate.
Figure 15:
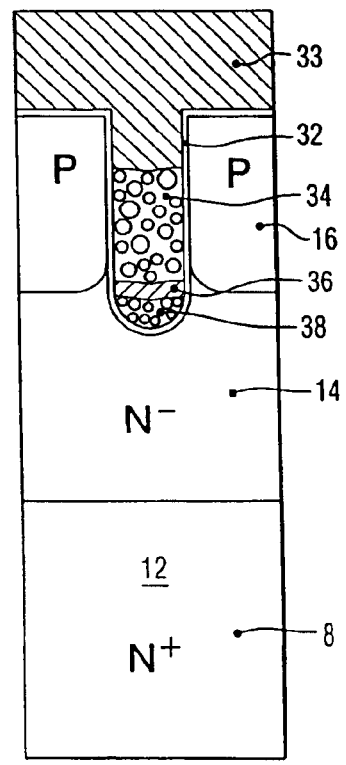
FIG. 15 is IDL (BPSG) deposition.
Figure 16:
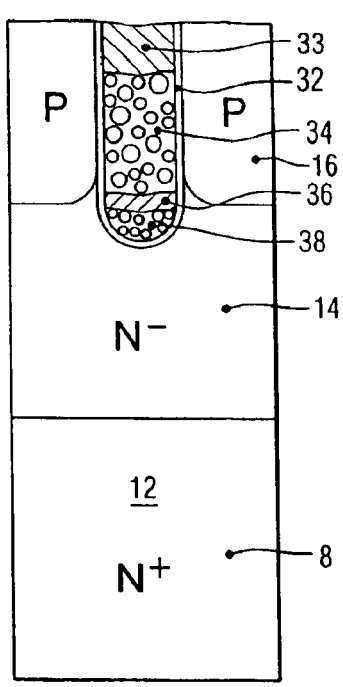
FIG. 16 is IDL (BPSG) etch back and planarization.
Figure 17:
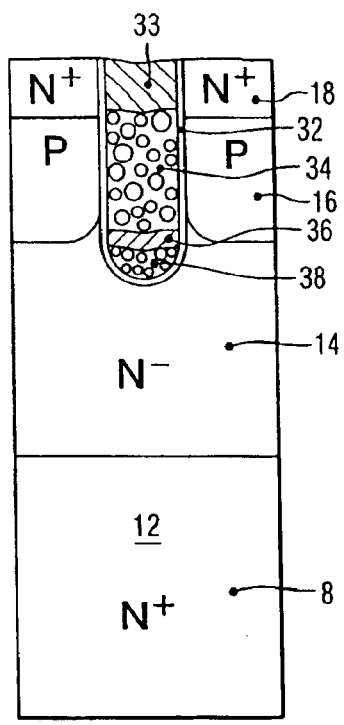
FIG. 17 is boron/phosphorous implant and drive to form the P+ body/N+ source.
Figure 18:
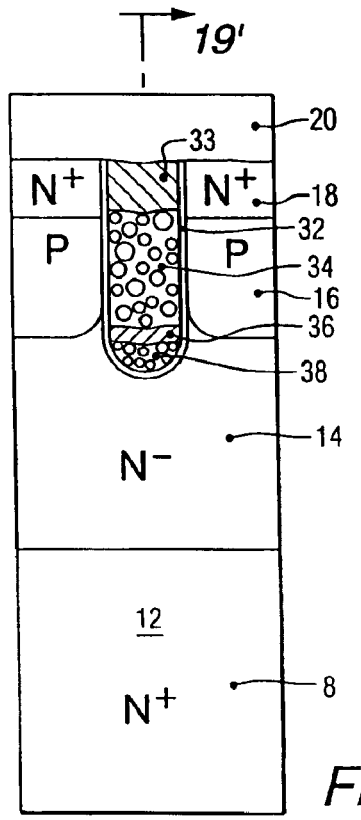
FIG. 18 is BOE dip, followed by Ti/TiN barrier layer formation and Metal deposition (SiAl).
Figure 19:
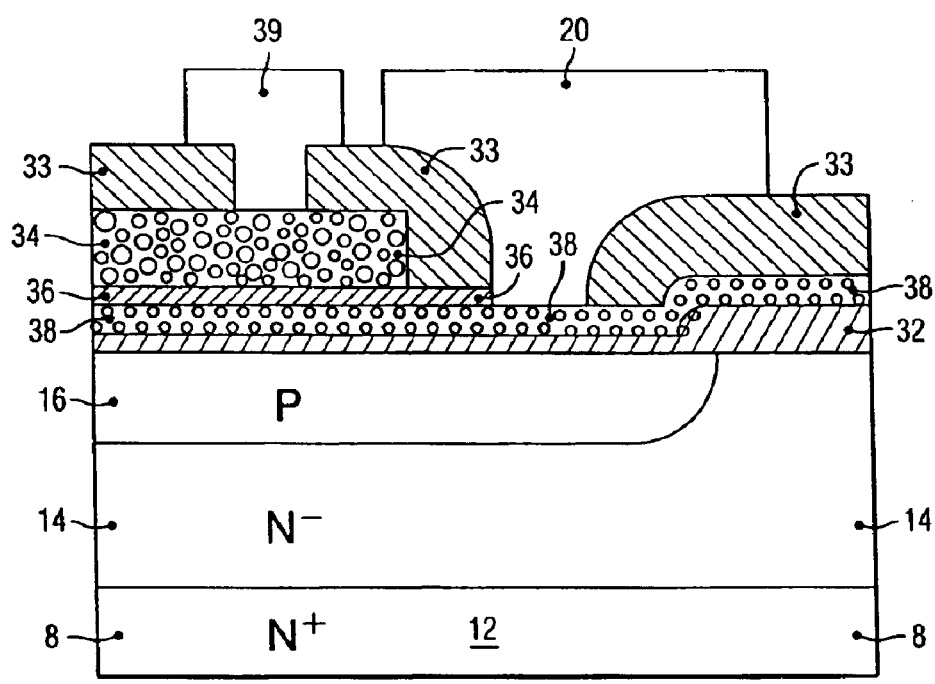
FIG. 19 is a section taken through the center of the trench of FIG. 18.

Turning to FIG. 14, the polysilicon gate layer 34 is etched in order to provide room in the trench for an interlevel dielectric layer. A suitable IDL layer 33, as shown in FIG. 15, comprising BPSG is deposited over the entire wafer 10 and into the remainder of the trenches. The BPSG layer 33 is planarized, as shown in FIG. 16, to approximately the same level as the top of the epitaxial layer 14. The entire surface of the device is subjected to a suitable N+ source implant such as phosphorous or arsenic. The source implant is suitably driven into an appropriate depth in order to form the source regions 18 as shown in FIG. 17. The wafer is then covered with a layer of metal 20 that forms the source metal which is then suitably patterned and finished to create the device. A section 19–19' is taken through the center of the trench of FIG. 18. A portion of the resulting profile at the edge of the wafer is shown in FIG. 19. The polysilicon shield 38 is in electrical and mechanical contact with the source 20 at the die periphery. As a result, the polysilicon shield layer 38 is electrically shorted to the source metal 20. This source metal is also in contact with the third layer. (not shown)

The remaining process steps are standard backend process steps for power semiconductor devices, including top surface tape, wafer grind, removal of tape and backside metalization, etc. While this invention has been described as having a preferred design, the present invention can be further modified within the spirit and scope of this disclosure. This application is therefore intended to cover any variations, uses, or adaptations of the present invention using the general principles disclosed herein. Furthermore, this application is intended to cover such departures from the present disclosure as come within the known or customary practice in the art to which this invention pertains and which fall within the limits of the appended claims.

What is claimed is:

1. A method for forming a semiconductor device with reduced Miller capacitance comprising the steps of:

heavily doping a substrate with a first conductivity dopant to form a drain region;

growing an epitaxial layer on the substrate and lightly doping the epitaxial layer with a dopant of the first conductivity;

implanting the surface of the epitaxial layer with dopants of a second polarity opposite in polarity to the first conductivity dopant;

covering the substrate with a trench mask having openings corresponding to desired trench regions and removing material from the exposed regions to form trenches;

growing an oxide layer of a substantially constant thickness on the trench walls and floor and diffusing the second conductivity dopant to form well regions adjacent the trench sidewalls;

forming over said oxide layer on said trench walls and floor upper and lower conductive layers respectively and separating the layers with a first dielectric layer;

removing a portion of said upper conductive layer; and forming source regions on the surface of the epitaxial layer with dopant of the first conductivity.

2. The method of claim 1 comprising the further step of covering the wafer with a source metal region.

3. The method of claim 1 comprising the further step of connecting the source metal regions to the lower conductive trench layers at locations proximate the periphery of the semiconductor device.

4. The method of claim 1 wherein the dopant of the first conductivity is p-type and the dopant of the second conductivity is n-type.

5. The method of claim 1 wherein the dopant the first conductivity is n-type and the dopant of the second conductivity is p-type.

6. The method of claim 1 wherein the bottom of the upper conductive layer is approximately on the same level as the bottom of the well regions of second conductivity.

7. The method of claim 1 wherein the dielectric layer separating the two conductive layers is silicon nitride.

8. The method of claim 1 further comprising the step of adding a second interlevel dielectric layer above said upper conductive layer.

9. The method of claim 8 wherein said second interlevel dielectric layer is borophosphosilicate glass.

* * * * *